(12) United States Patent
Fujimori

(10) Patent No.: US 9,252,108 B2
(45) Date of Patent: Feb. 2, 2016

(54) SEMICONDUCTOR DEVICE HAVING MAGNETIC SHIELD LAYER SURROUNDING MRAM CHIP

(71) Applicant: KABUSHIKI KAISHA TOSHIBA, Minato-ku, Tokyo (JP)

(72) Inventor: Takeshi Fujimori, Chigasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/140,393

(22) Filed: Dec. 24, 2013

(65) Prior Publication Data

US 2015/0084141 A1    Mar. 26, 2015

(30) Foreign Application Priority Data

Sep. 24, 2013    (JP) .................. 2013-197033

(51) Int. Cl.
| | | |
|---|---|---|
| H01L 29/82 | (2006.01) | |
| H01L 23/552 | (2006.01) | |
| H01L 25/065 | (2006.01) | |
| H01L 27/22 | (2006.01) | |

(52) U.S. Cl.
CPC .......... *H01L 23/552* (2013.01); *H01L 25/0657* (2013.01); *H01L 27/228* (2013.01); *H01L 2224/32145* (2013.01); *H01L 2224/48091* (2013.01); *H01L 2224/48227* (2013.01); *H01L 2224/73265* (2013.01); *H01L 2225/0651* (2013.01); *H01L 2225/06541* (2013.01); *H01L 2225/06562* (2013.01); *H01L 2225/06565* (2013.01); *H01L 2924/15311* (2013.01)

(58) Field of Classification Search
CPC ....... H01L 43/08; H01L 27/22; H01L 43/065; G11C 11/16
USPC ............. 257/421–427, E29.323; 438/3; 360/324–326, 313; 365/157–158, 365/171–173
See application file for complete search history.

(56) References Cited

U.S. PATENT DOCUMENTS

| | | | |
|---|---|---|---|
| 6,664,624 B2 | 12/2003 | Haematsu | |
| 7,009,818 B1 | 3/2006 | Arnold et al. | |
| 8,258,604 B2 | 9/2012 | Bando et al. | |
| 2002/0145902 A1* | 10/2002 | Kunikiyo et al. | 365/97 |
| 2004/0048463 A1 | 3/2004 | Haematsu | |
| 2005/0230788 A1 | 10/2005 | Kato et al. | |

(Continued)

FOREIGN PATENT DOCUMENTS

| | | |
|---|---|---|
| JP | 02-005018 B2 | 1/1990 |
| JP | 05-074771 A | 3/1993 |

(Continued)

OTHER PUBLICATIONS

U.S. Appl. No. 14/166,703, filed Jan. 28, 2014, Title: "Semiconductor Device and Method of Manufacturing the Same", First Named Inventor: Kenji Noma.

*Primary Examiner* — Jami M Valentine
(74) *Attorney, Agent, or Firm* — Holtz, Holtz & Volek PC

(57) ABSTRACT

According to one embodiment, a semiconductor device includes a MRAM chip including a semiconductor substrate and a memory cell array area includes magnetoresistive elements which are provided on the semiconductor substrate, and a magnetic shield layer surrounding the memory cell array area in a circumferential direction of the MRAM chip, and having a closed magnetic path.

10 Claims, 20 Drawing Sheets

(56) References Cited

U.S. PATENT DOCUMENTS

| | | |
|---|---|---|
| 2006/0108668 A1* | 5/2006 | Knudsen .................. 257/659 |
| 2006/0289970 A1* | 12/2006 | Gogl et al. .............. 257/659 |
| 2009/0045488 A1 | 2/2009 | Chang et al. |
| 2009/0122597 A1* | 5/2009 | Sugibayashi et al. ......... 365/158 |
| 2012/0211846 A1 | 8/2012 | Li et al. |
| 2012/0293170 A1 | 11/2012 | Nakajima et al. |
| 2012/0309131 A1 | 12/2012 | Bando et al. |
| 2015/0008547 A1 | 1/2015 | Pi et al. |
| 2015/0069545 A1* | 3/2015 | Noma ..................... 257/421 |

FOREIGN PATENT DOCUMENTS

| | | |
|---|---|---|
| JP | 06-267962 A | 9/1994 |
| JP | 2004-064016 A | 2/2004 |
| JP | 2010123666 A | 6/2010 |
| JP | 2011114211 A | 6/2011 |

\* cited by examiner

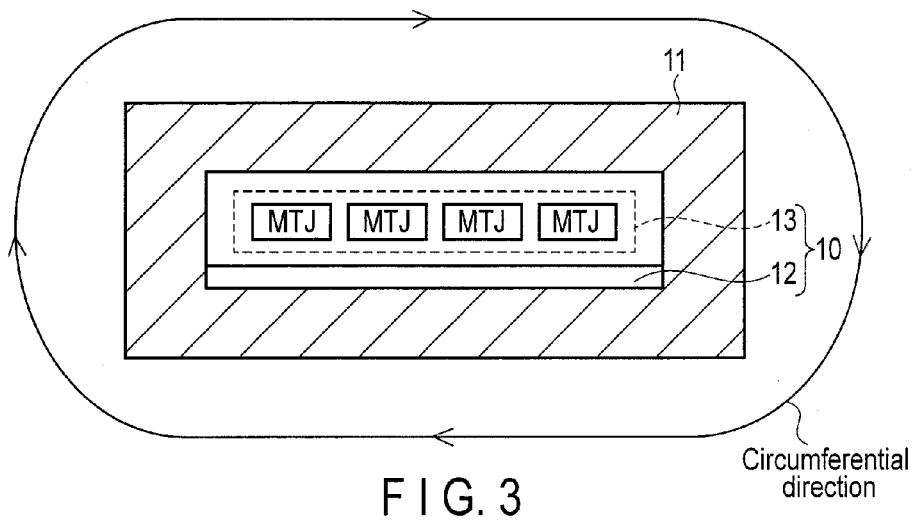
F I G. 3
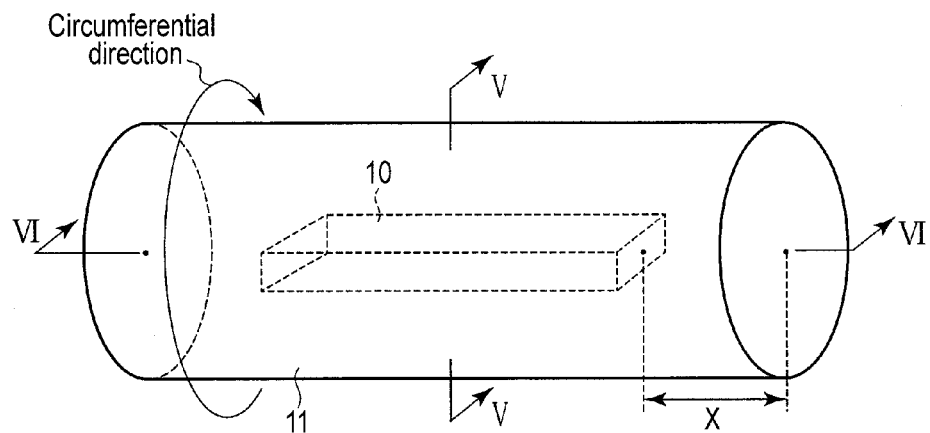
F I G. 4
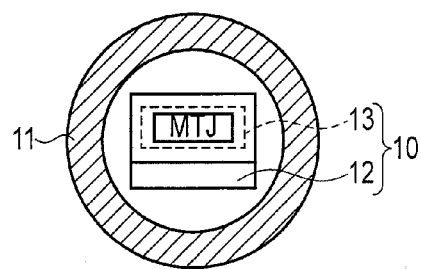
F I G. 5

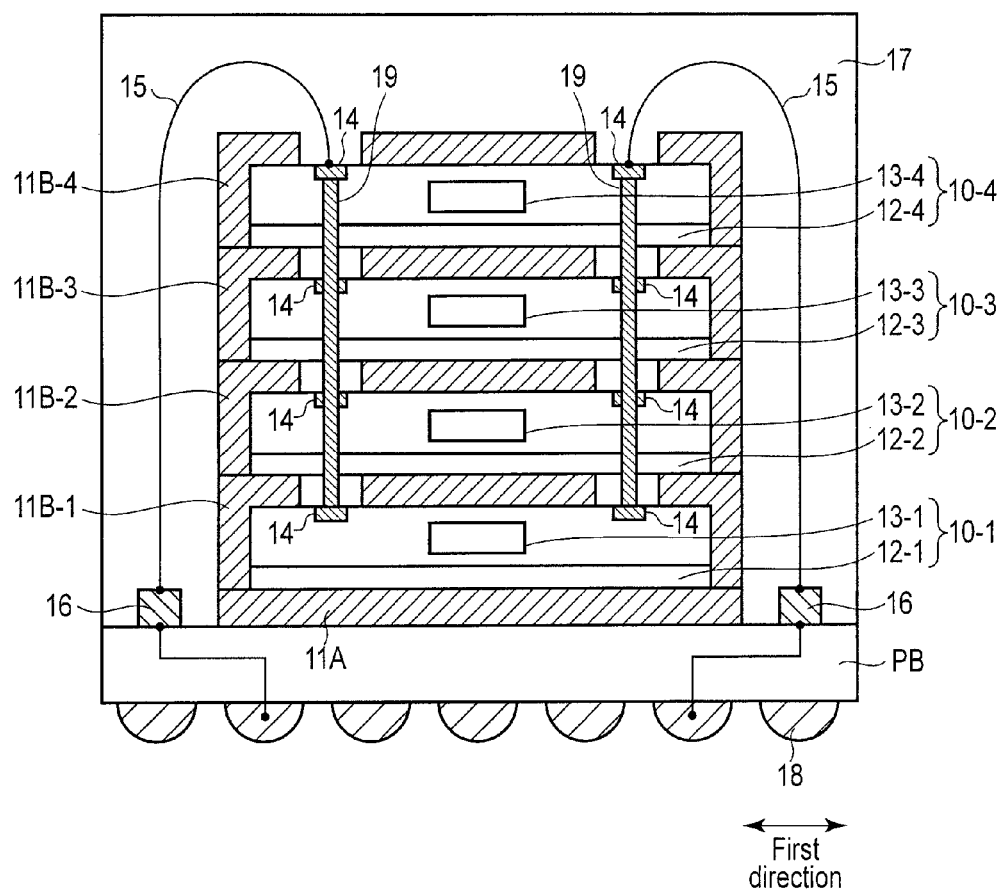
F I G. 14

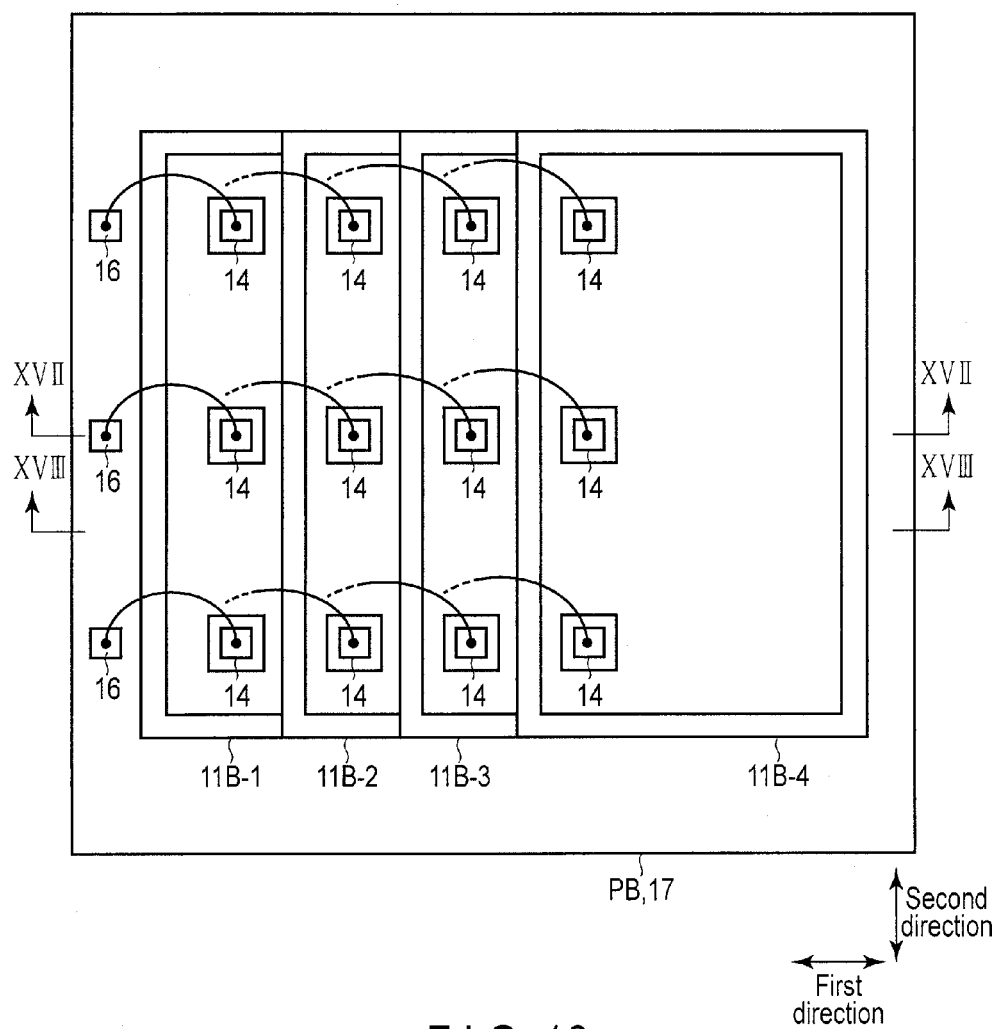
F I G. 16

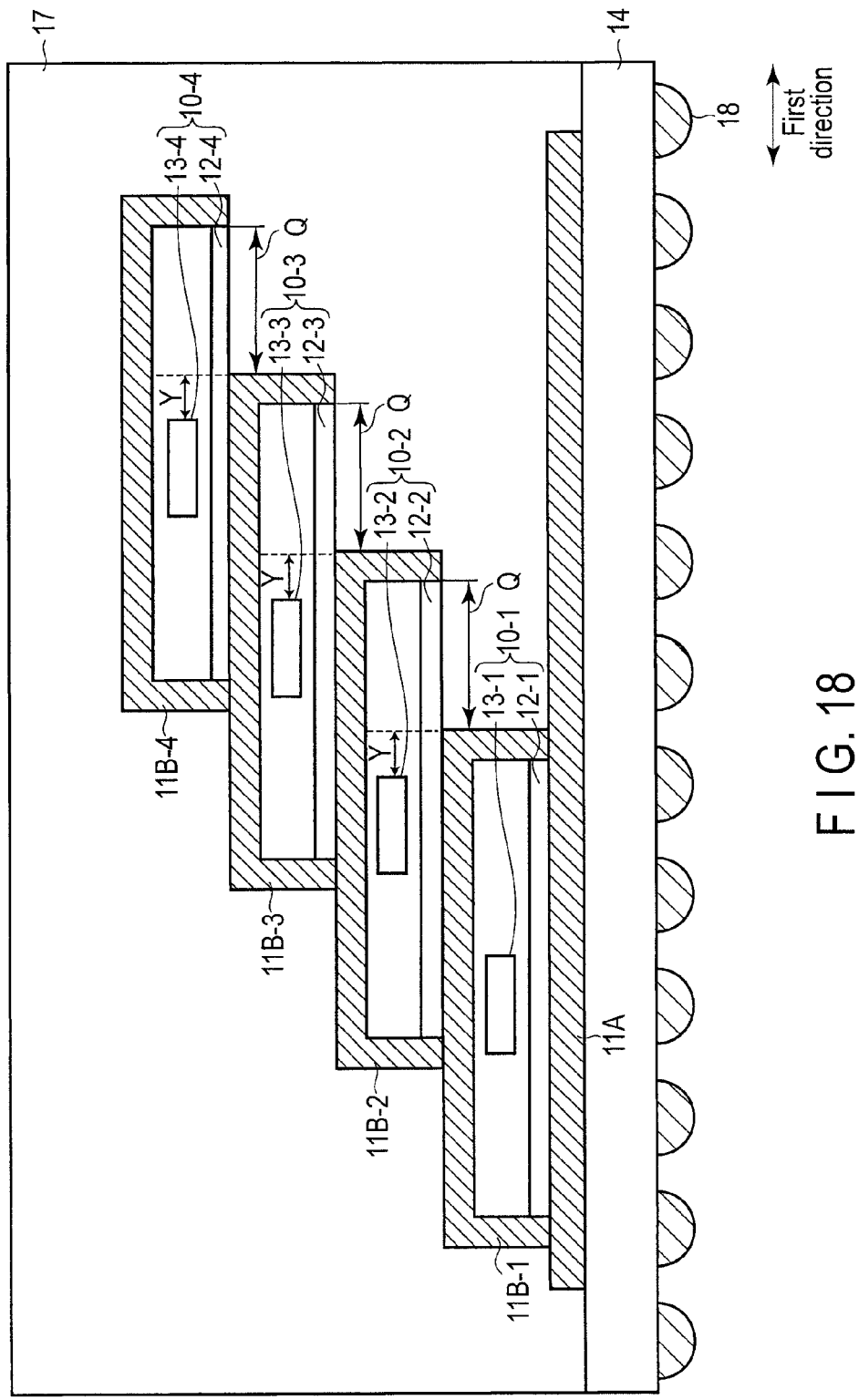
F I G. 18

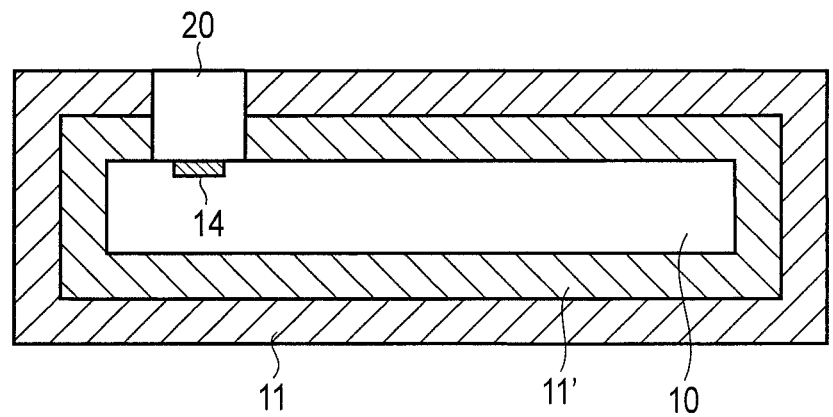
F I G. 24
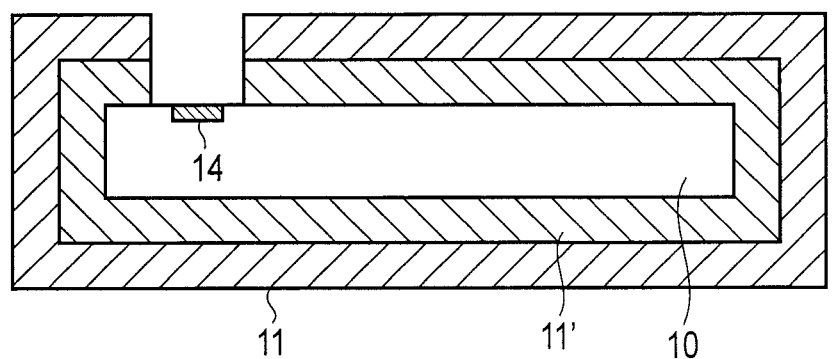
F I G. 25

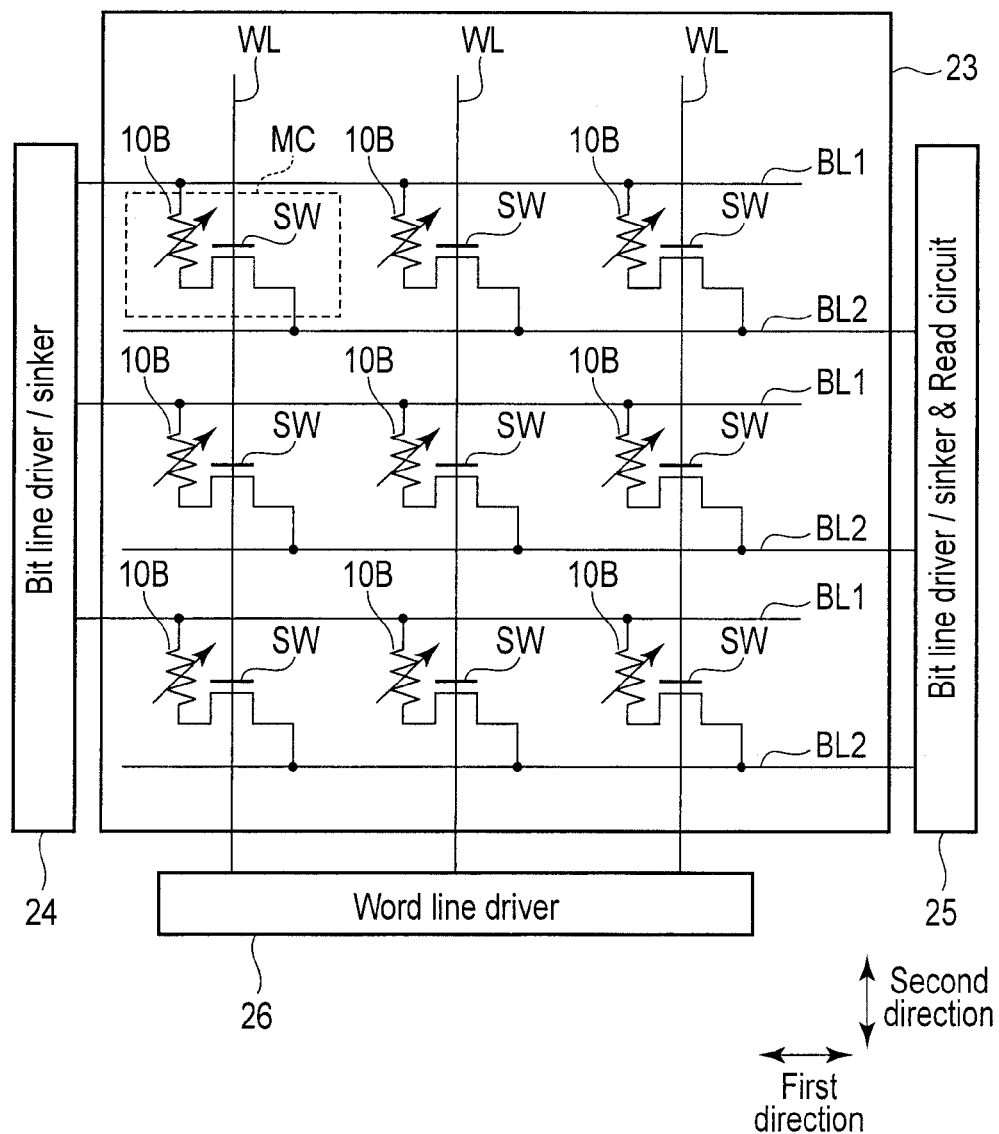
F I G. 32

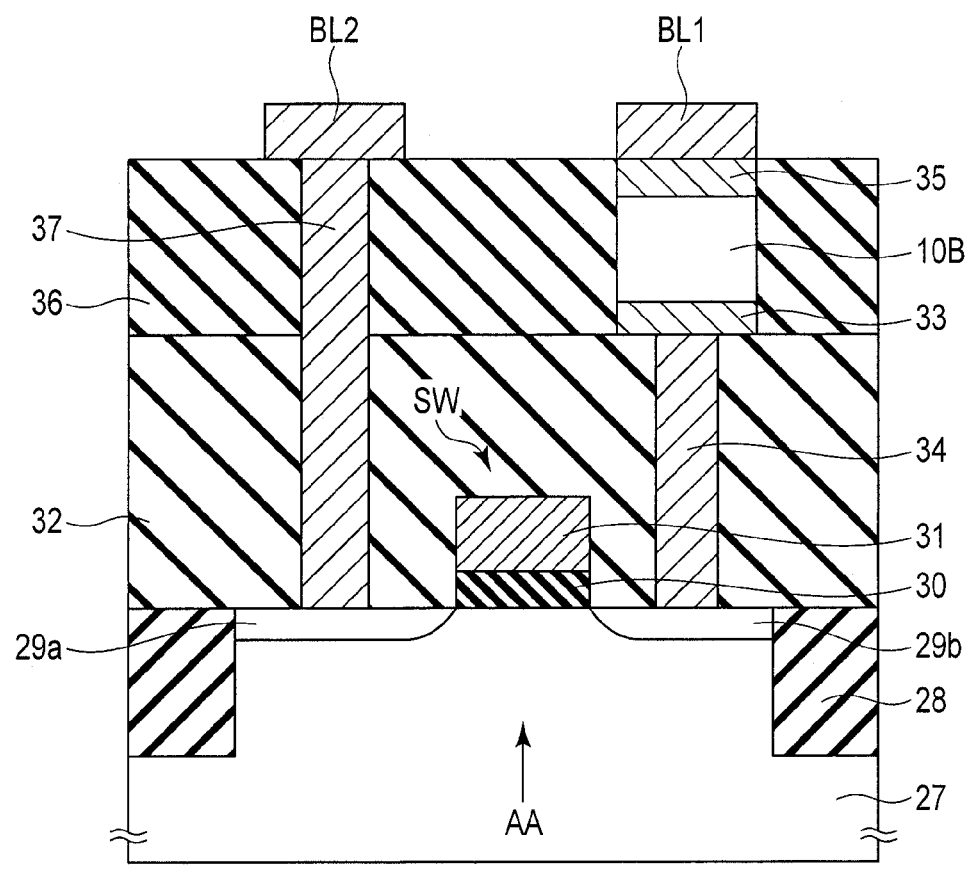
F I G. 33

SEMICONDUCTOR DEVICE HAVING MAGNETIC SHIELD LAYER SURROUNDING MRAM CHIP

CROSS-REFERENCE TO RELATED APPLICATIONS

This application is based upon and claims the benefit of priority from Japanese Patent Application No. 2013-197033, filed Sep. 24, 2013, the entire contents of which are incorporated herein by reference.

FIELD

Embodiments described herein relate generally to a semiconductor device and a method of manufacturing the same.

BACKGROUND

A magnetic random access memory (MRAM) chip used as a nonvolatile semiconductor memory device controls operations, such as writing, reading and data storage, utilizing magnetization of a magnetoresistive element. Accordingly, if the magnetization of the magnetoresistive element is influenced by an external magnetic field passing through the MRAM chip, the operations may well vary. In view of this, it is desirable to block the external magnetic field using a magnetic shield layer so that the external magnetic field does not enter the MRAM chip.

BRIEF DESCRIPTION OF THE DRAWINGS

FIG. 3 is a cross-sectional view taken along line of FIG. 1;
FIG. 4 is a perspective view showing a second embodiment;
FIG. 5 is a cross-sectional view taken along line V-V of FIG. 4;
FIG. 14 is a cross-sectional view taken along line XIV-XIV of FIG. 13;
FIG. 16 is a plan view of a sixth embodiment;
FIG. 18 is a cross-sectional view taken along line XVIII-XVIII of FIG. 16;
FIG. 24 is a cross-sectional view of the second example of the manufacturing method;
FIG. 25 is a cross-sectional view of the second example of the manufacturing method;
FIG. 32 is a circuit diagram showing a circuit including a magnetoresistive element;
and
FIG. 33 is a cross-sectional view of a memory cell example.

DETAILED DESCRIPTION

In general, according to one embodiment, a semiconductor device comprises: a MRAM chip including a semiconductor substrate and a memory cell array area comprising magnetoresistive elements which are provided on the semiconductor substrate; and a magnetic shield layer surrounding the memory cell array area in a circumferential direction of the MRAM chip, and having a closed magnetic path.

Embodiments will be described with reference to the accompanying drawings.

First Embodiment

Figure 1:
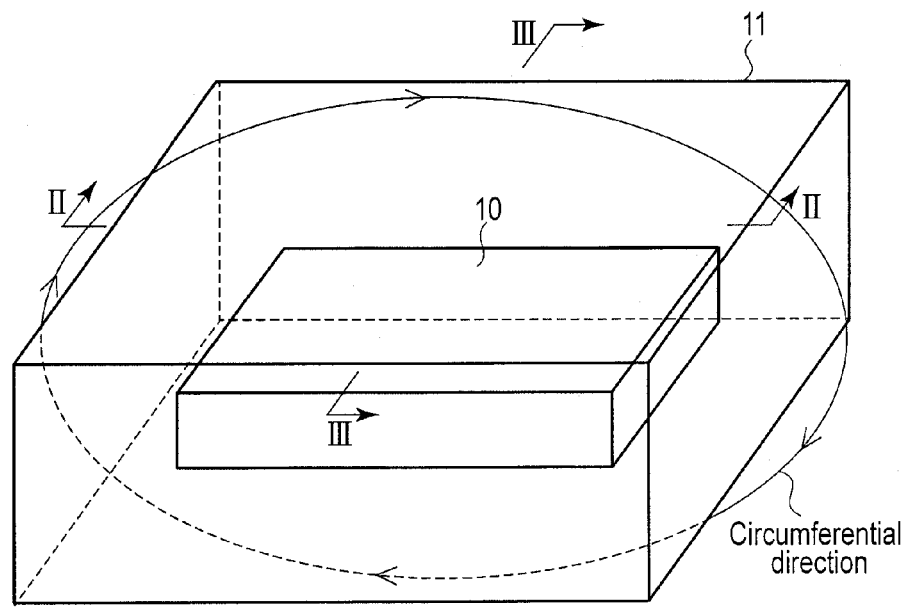
FIG. 1 is a perspective view showing a first embodiment.
Figure 2:
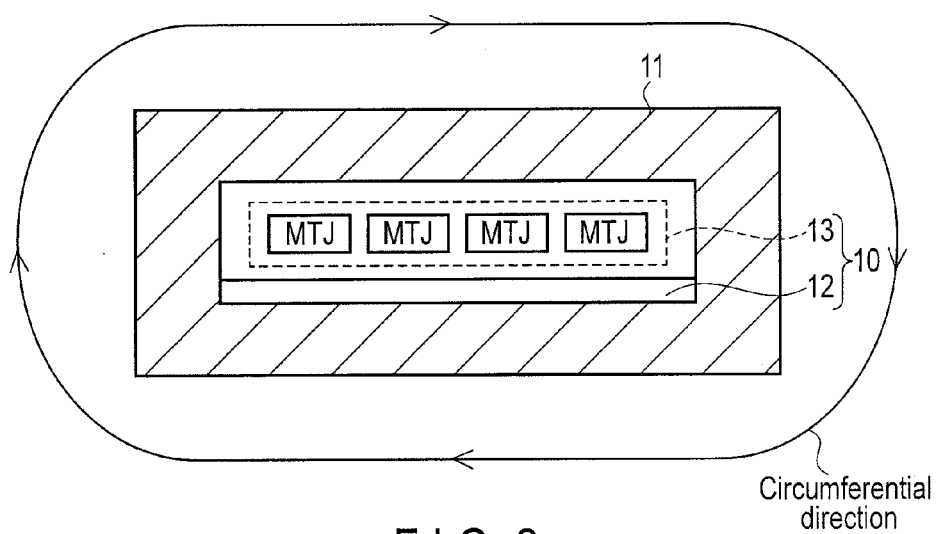
FIG. 2 is a cross-sectional view taken along line II-II of FIG. 1.

FIG. 1 is a perspective view showing a first embodiment. FIG. 2 is a cross-sectional view taken along line II-II of FIG. 1. FIG. 3 is a cross-sectional view taken along line of FIG. 1.

A semiconductor device according to the first embodiment comprises an MRAM chip 10 having a memory cell array area 13, and a magnetic shield layer 11 circumferentially surrounding the memory cell array area 13 of the MRAM chip 10 and providing a closed magnetic path. The MRAM chip 10 comprises a semiconductor substrate 12, on which the memory cell array area 13 is provided.

The memory cell array area 13 comprises a plurality of memory cells. Each memory cell comprises a magnetoresistive element MTJ. For instance, one memory cell comprises one magnetoresistive element MTJ. Further, one memory cell may include a diode (in the case of a cross point type memory cell array area), a selective transistor (in the case of a one transistor-one magnetoresistive element type memory cell array), etc.

The magnetoresistive element MTJ is an element configured to store data utilizing a magnetoresistive effect. The basic structure of the magnetoresistive element MTJ comprises a reference layer having a constant magnetism, a memory layer having a variable magnetism, and a tunnel barrier layer between the reference layer and the memory layer.

The magnetoresistive element MTJ can assume a parallel state in which the residual magnetization direction of the memory layer is the same as that of the reference layer, or an anti-parallel state in which the residual magnetization direction of the memory layer is opposite to that of the reference layer.

For instance, the magnetoresistive element MTJ has a low resistance in the parallel state, and has a high resistance in the anti-parallel state. Namely, the magnetoresistive element MTJ can store the difference between these resistances as binary data.

In order to accurately write data to the magnetoresistive element MTJ, to accurately read data from the magnetoresistive element MTJ, and to store data in the magnetoresistive element MTJ for a long time, it is important to block external magnetic fields that will influence the magnetization of the magnetoresistive element MTJ.

In the above-mentioned structure, the magnetic shield layer 11 circumferentially surrounds the memory cell array area 13 of the MRAM chip 10. Namely, the magnetic shield layer 11 has a closed loop structure in a first cross section (see FIG. 2) that is perpendicular to the major surface of the semiconductor substrate 12 and is parallel to a circumferential direction. Accordingly, the magnetic shield layer 11 can prevent external magnetic fields from entering the MRAM chip 10.

As a result, the operations (writing, reading and data storage) of the MRAM chip 10 can be accurately performed without the influence of the external magnetic fields.

It is desirable that the magnetic shield layer 11 have a high magnetic permeability and a high saturated magnetization.

Materials for realizing this are, for example, Ni, Fe, Co, an Ni—Fe alloy, an Fe—Co alloy, and $Fe_2O_4$ containing Mn, Ni or Zn.

It is also desirable that the magnetic shield layer 11 have a thickness of 100 nm or more and 100 μm or less.

The magnetoresistive element MTJ is of a perpendicular magnetization type in which the element has magnetization perpendicular to the major surface of the semiconductor substrate 12, or of an in-plane magnetization type in which the element has magnetization parallel to the major surface of the semiconductor substrate 12.

The perpendicular magnetization type magnetoresistive element MTJ is easily influenced by an external magnetic field of the same magnetization direction as that of the memory layer, i.e., by an external magnetic field of a magnetization direction perpendicular to the major surface of the semiconductor substrate 12. Since, however, this external magnetic field is prevented from entering the MRAM chip 10 by the closed magnetic path of the magnetic shield layer 11, it does not influence the magnetization of the magnetoresistive elements MTJ in the memory cell array area 13.

On the other hand, the in-plane magnetization type magnetoresistive element MTJ is easily influenced by an external magnetic field of the same magnetization direction as that of the memory layer, i.e., by an external magnetic field of a magnetization direction parallel to the major surface of the semiconductor substrate 12. Since, however, this external magnetic field is prevented from entering the MRAM chip 10 by the magnetic shield layer 11 located on the upper and lower surfaces of the MRAM chip 10, it does not influence the magnetization of the magnetoresistive elements MTJ in the memory cell array area 13.

As described above, the semiconductor device of the first embodiment prevents external magnetic fields from entering the MRAM chip 10 to thereby stabilize the operations of the MRAM chip 10.

Second Embodiment

Figure 6:
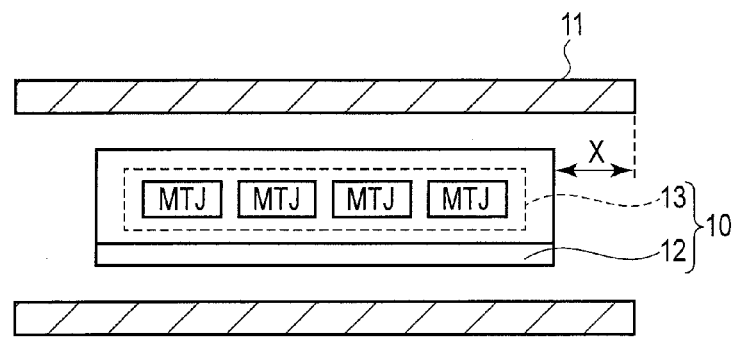
FIG. 6 is a cross-sectional view taken along line VI-VI of FIG. 4.

FIG. 4 is a perspective view showing a second embodiment. FIG. 5 is a cross-sectional view taken along line V-V of FIG. 4. FIG. 6 is a cross-sectional view taken along line VI-VI of FIG. 4.

The semiconductor device of the second embodiment comprises an MRAM chip 10 having a memory cell array area 13, and a magnetic shield layer 11 circumferentially surrounding the memory cell array area 13 of the MRAM chip 10 and providing a closed magnetic path. The MRAM chip 10 comprises a semiconductor substrate 12, on which the memory cell array area 13 is provided.

The magnetic shield layer 11 has a closed loop structure in a first cross section (see FIG. 5) that is perpendicular to the major surface of the semiconductor substrate 12 and is parallel to a circumferential direction. Accordingly, the magnetic shield layer 11 can prevent external magnetic fields from entering the MRAM chip 10.

Further, the magnetic shield layer 11 has ends in a second cross section (see FIG. 6) perpendicular to the first cross section and parallel to the major surface of the semiconductor substrate 12. It is desirable to set the distance X between each end of the layer 11 and the MRAM chip 10 as long as possible.

In the second embodiment, the magnetic shield layer 11 is separate from the MRAM chip 10. However, it may be in contact with the MRAM chip 10.

The magnetoresistive elements MTJ employed in the second embodiment are similar to those of the first embodiment, and therefore will not be described. The relationship between the magnetoresistive element MTJ type (perpendicular magnetization/in-plane magnetization) and the external magnetic field is also similar to that in the first embodiment, and therefore will not be described.

By virtue of the above-described structure of the second embodiment, external magnetic fields can, be prevented by the magnetic shield layer 11 from entering the MRAM chip 10. As a result, the operations (writing, reading and data storage) of the MRAM chip 10 can be reliably performed without the influence of the external magnetic fields.

Third Embodiment

Figure 7:
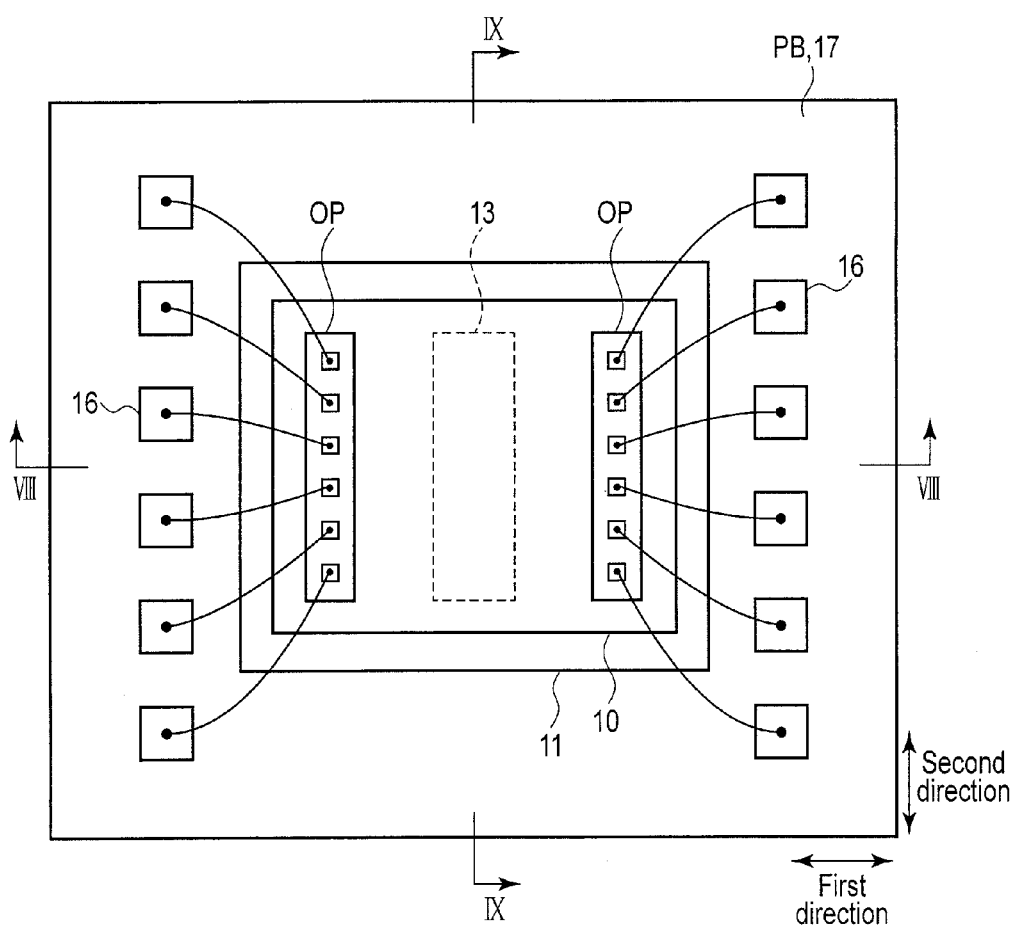
FIG. 7 is a plan view of a third embodiment.
Figure 8:
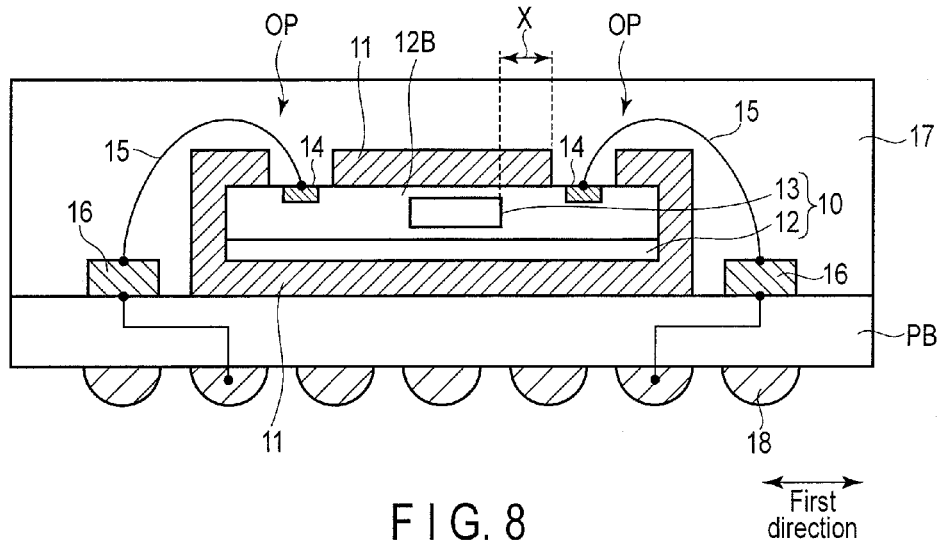
FIG. 8 is a cross-sectional view taken along line VIII-VIII of FIG. 7.
Figure 9:
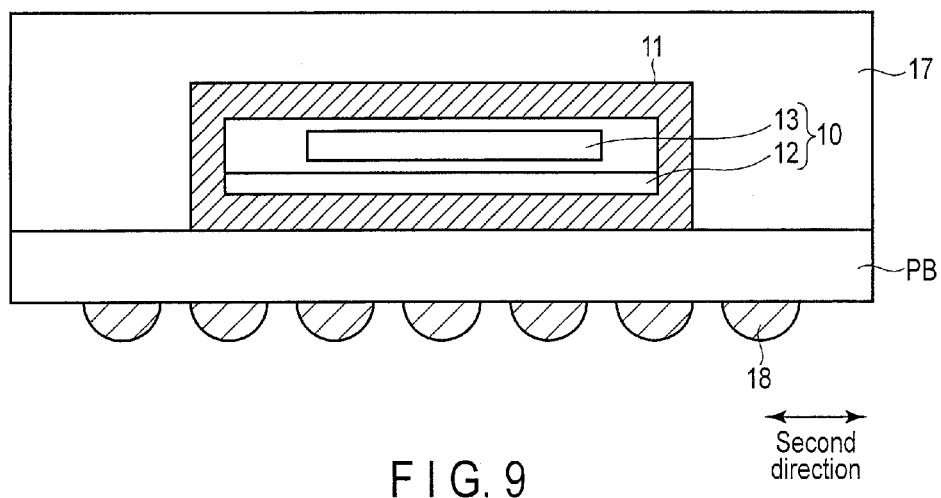
FIG. 9 is a cross-sectional view taken along line IX-IX of FIG. 7.

FIG. 7 is a plan view of a third embodiment. FIG. 8 is a cross-sectional view taken along line VIII-VIII of FIG. 7. FIG. 9 is a cross-sectional view taken along line IX-IX of FIG. 7.

A semiconductor device according to the third embodiment comprises a printed board (e.g., an epoxy board) PB, an MRAM chip 10 provided on the circuit board PB and having a memory cell array area 13, a magnetic shield layer 11 circumferentially surrounding the memory cell array area 13 of the MRAM chip 10 and having a closed magnetic path, and a sealing member (formed of, for example, a resin) 17 covering the MRAM chip 10.

The MRAM chip 10 comprises a semiconductor substrate 12, and the memory cell array area 13 is located on the semiconductor substrate 12. The MRAM 10 also comprises pads 14. For instance, the pads 14 are connected to external terminals (e.g., solder balls) 18, provided on the reverse surface of the printed board PB, via bonding wires 15 and conductive lines 16 on the printed board PB.

The semiconductor device of the third embodiment is characterized in that the MRAM chip 10 is packaged, and that no magnetic shield layer 11 is provided on the pads 14 of the MRAM chip 10.

To prevent external magnetic fields from entering the MRAM chip, it is desirable that the magnetic shield layer 11 completely covers the MRAM chip 10 as shown in FIGS. 1 to 3. However, in general, the MRAM chip 10 has pads for realizing electrical connection with external elements. In this case, it is necessary to remove parts of the magnetic shield layer 11 located on the pads 14 of the MRAM chip 10, as mentioned above.

In view of preventing erroneous operations of the MRAM chip 10 due to external magnetic fields, it is sufficient if the magnetic shield layer 11 at least circumferentially surrounds the memory cell array area 13. This is because erroneous operations may well be caused by the influence of the external magnetic fields on the magnetization of the magnetoresistive elements MTJ in the memory cell array area 13.

In view of the above, in the third embodiment, based on the structures shown in FIGS. 4 to 6, the magnetic shield layer 11 circumferentially surrounds at least the memory cell array area 13. Namely, openings OP in the magnetic shield layer 11 are located near the edges of the MRAM chip 10 where no memory cell array area 13 exists.

In this case, the magnetic shield layer 11 has a closed loop structure in a first cross section (see FIG. 9) perpendicular to the major surface of the semiconductor substrate 12 and parallel to a circumferential direction. Accordingly, the magnetic shield layer 11 can prevent external magnetic fields from entering the memory cell array area 13 of the MRAM chip 10.

Further, the magnetic shield layer 11 has ends in a second cross section (see FIG. 8) perpendicular to the first cross section and parallel to the major surface of the semiconductor substrate 12. It is desirable to set the distance X between each end of the layer 11 and the MRAM chip 10 as long as possible.

The magnetoresistive elements MTJ employed in the third embodiment are similar to those of the first embodiment, and therefore will not be described. The relationship between the magnetoresistive element MTJ type (perpendicular magnetization/in-plane magnetization) and the external magnetic field is also similar to that in the first embodiment, and therefore will not be described.

Although it is assumed in the third embodiment that the sealing member 17 is formed of a resin, it may be a metal cap. Similarly, although it is assumed in the third embodiment that the external terminals 18 of the package are solder balls, they may be conductive pins (such as metal pillars).

By virtue of the above-described structure of the third embodiment, external magnetic fields can be prevented by the magnetic shield layer 11 from entering the memory cell array area 13 of the MRAM chip 10. As a result, the operations (writing, reading and data storage) of the MRAM chip 10 can be reliably performed without the influence of the external magnetic fields.

Fourth Embodiment

Figure 10:
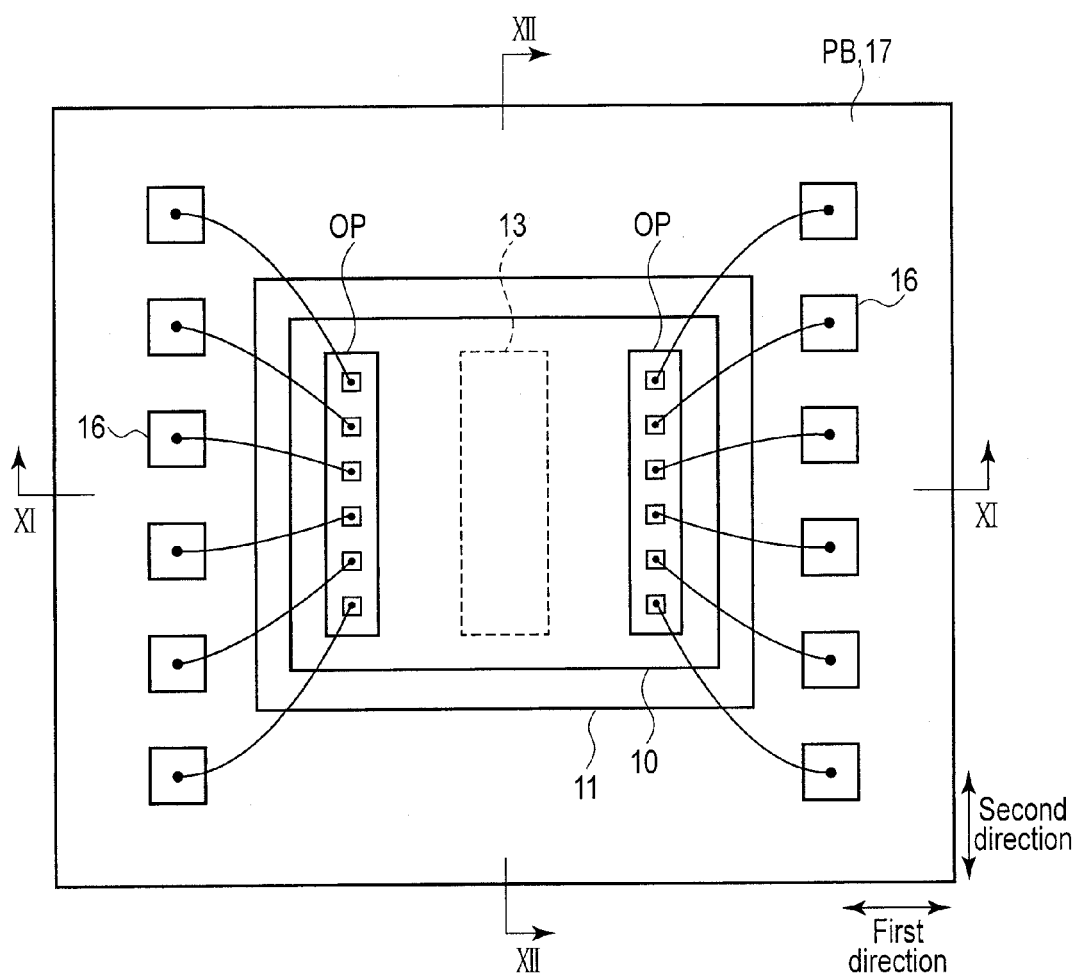
FIG. 10 is a plan view of a fourth embodiment.
Figure 11:
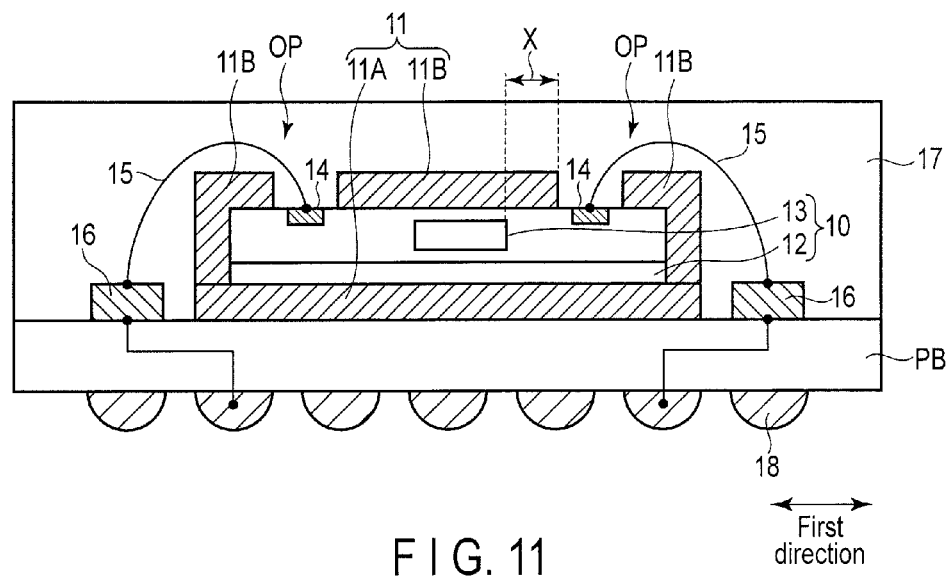
FIG. 11 is a cross-sectional view taken along line XI-XI of FIG. 10.
Figure 12:
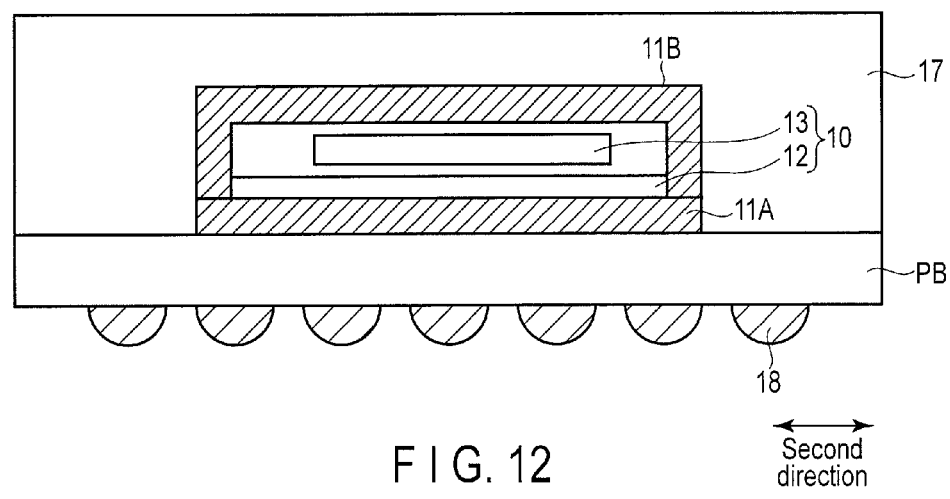
FIG. 12 is a cross-sectional view taken along line XII-XII of FIG. 10.

FIG. 10 is a plan view of a fourth embodiment. FIG. 11 is a cross-sectional view taken along line XI-XI of FIG. 10. FIG. 12 is a cross-sectional view taken along line XII-XII of FIG. 10.

A semiconductor device according to the fourth embodiment is a modification of the semiconductor device of the third embodiment. The semiconductor device of the fourth embodiment differs from the semiconductor device of the third embodiment in that in the former, the magnetic shield layer 11 comprises a magnetic shield layer 11A beforehand printed on the printed board PB, and a magnetic shield layer 11B provided on the MRAM chip 10.

These two magnetic shield layers 11A and 11B may be formed of the same material or different materials. Further, if a magnetic shield function is imparted to conductive layers 16 on the printed board PB, the conductive layers 16 and the magnetic shield layer 11A can be formed of the same material. In this case, the conductive layers 16 and the magnetic shield layer 11A can be simultaneously formed on the printed board PB, which contributes to manufacturing cost reduction.

The points in the fourth embodiment other than the above are similar to those in the third embodiment. Therefore, elements in FIGS. 10 to 12 similar to those in FIGS. 7 to 9 are denoted by corresponding reference numbers, and no detailed description is given thereof.

Fifth Embodiment

Figure 13:
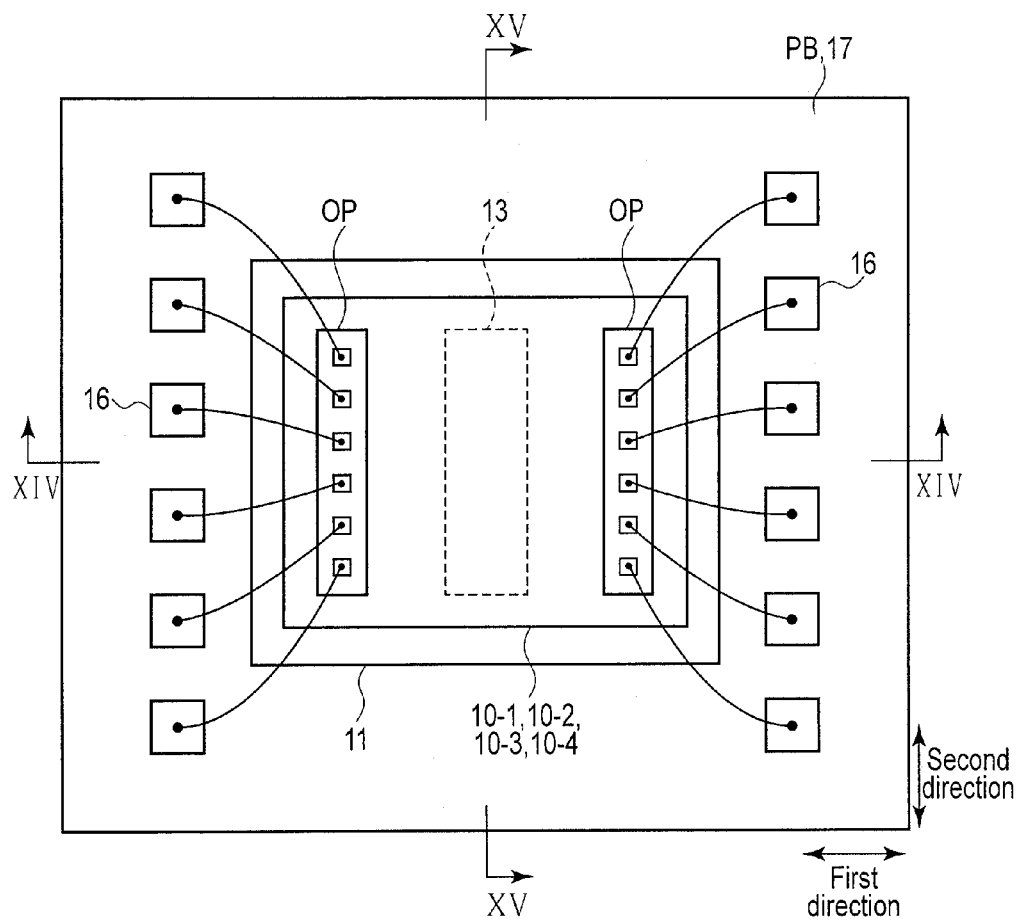
FIG. 13 is a plan view of a fifth embodiment.
Figure 15:
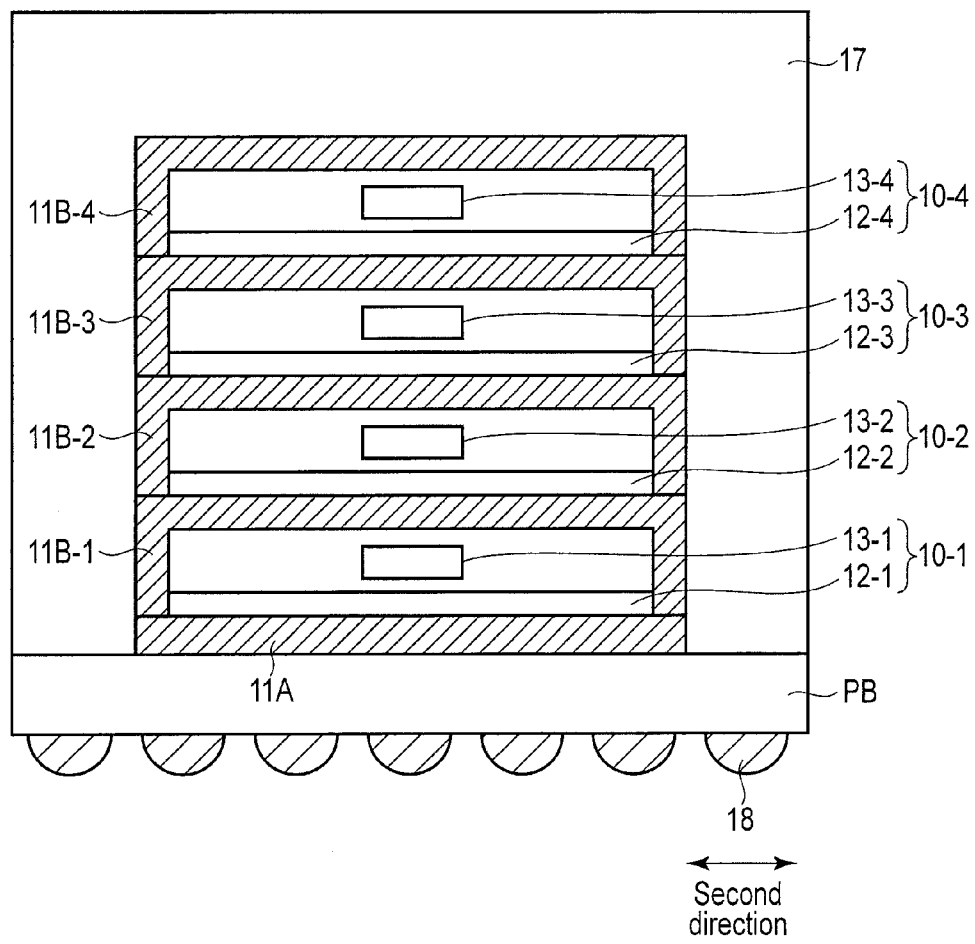
FIG. 15 is a cross-sectional view taken along line XV-XV of FIG. 13.

FIG. 13 is a plan view of a fifth embodiment. FIG. 14 is a cross-sectional view taken along line XIV-XIV of FIG. 13. FIG. 15 is a cross-sectional view taken along line XV-XV of FIG. 13.

A semiconductor device according to the fifth embodiment is a modification of the semiconductor device of the fourth embodiment. The semiconductor device of the fifth embodiment differs from the semiconductor device of the fourth embodiment in that in the former, a plurality of MRAM chips (in this embodiment, four MRAM chips) 10-1, 10-2, 10-3 and 10-4 are stacked on each other on the printed board PB.

The MRAM chips 10-1, 10-2, 10-3 and 10-4 comprise semiconductor substrates 12-1, 12-2, 12-3 and 12-4, and memory cell array areas 13-1, 13-2, 13-3 and 13-4 on the semiconductor substrates, respectively.

The MRAM chips 10-1, 10-2, 10-3 and 10-4 are covered with magnetic shield layers 11B-1, 11B-2, 11B-3 and 11B-4, respectively.

The MRAM chips 10-1, 10-2, 10-3 and 10-4 are electrically connected to each other by through vias 19 (such as through silicon vias (TSV)).

By thus installing a plurality of MRAM chips 10-1, 10-2, 10-3 and 10-4 in one package, increase in memory capacity and further cost reduction for each bit can be realized.

The points in the fifth embodiment other than the above are similar to those in the fourth embodiment. Therefore, elements in FIGS. 13 to 15 similar to those in FIGS. 10 to 12 are denoted by corresponding reference numbers, and no detailed description is given thereof.

Sixth Embodiment

Figure 17:
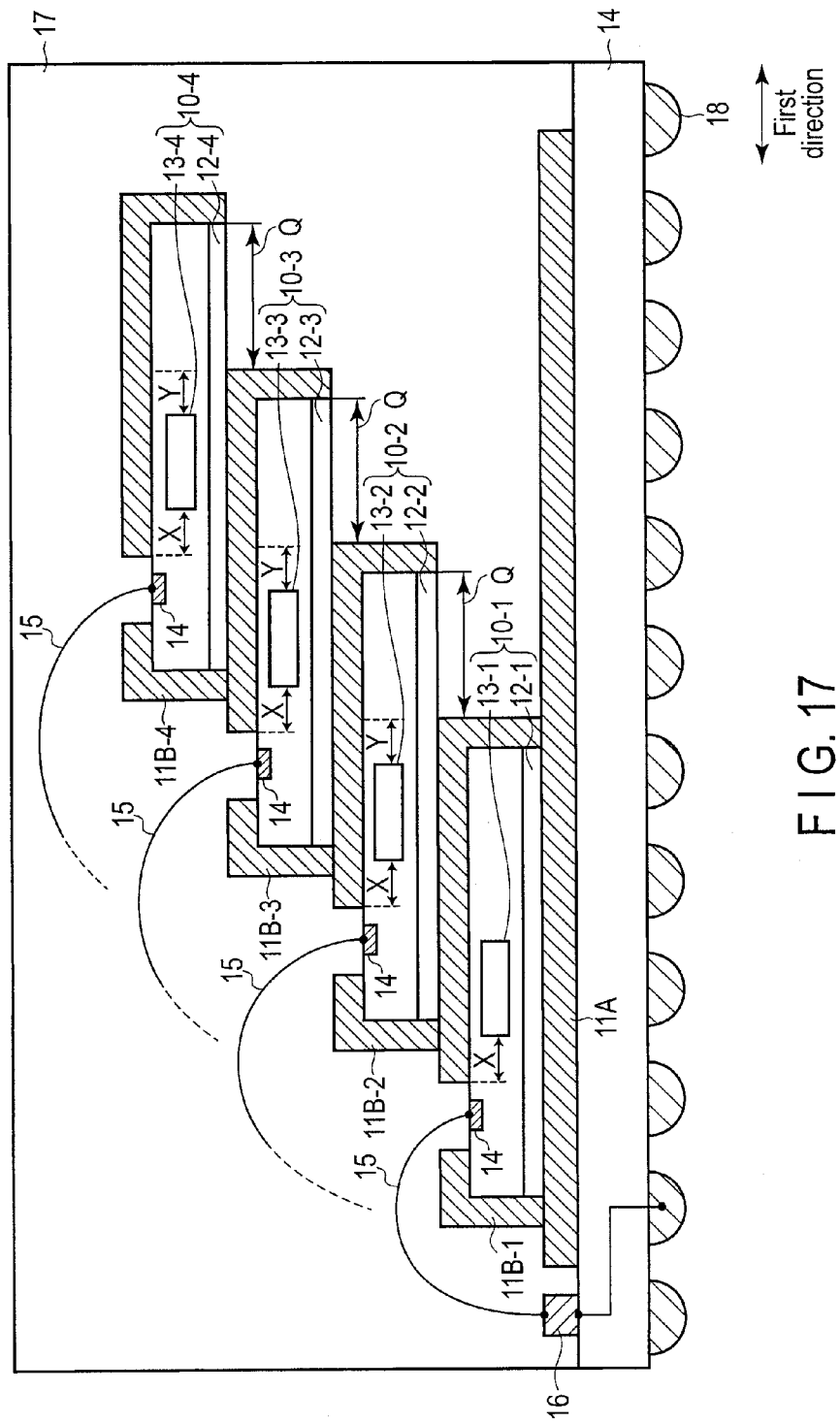
FIG. 17 is a cross-sectional view taken along line XVII-XVII of FIG. 16.

FIG. 16 is a plan view of a sixth embodiment. FIG. 17 is a cross-sectional view taken along line XVII-XVII of FIG. 16. FIG. 18 is a cross-sectional view taken along line XVIII-XVIII of FIG. 16.

A semiconductor device according to the sixth embodiment is a modification of the semiconductor device of the fifth embodiment. The semiconductor device of the sixth embodiment differs from the semiconductor device of the fifth embodiment in that in the former, the plurality of MRAM chips 10-1, 10-2, 10-3 and 10-4 stacked on each other on the printed board PB are shifted from each other when viewed from above the package.

The MRAM chips 10-1, 10-2, 10-3 and 10-4 are shifted from each other so that pads 14 are electrically connected to conductive lines 16 by bonding wires 15. Electrical connection using the bonding wires 15 is more advantageous than, for example, electrical connection using through vias in the fifth embodiment, since the former can be realized at lower cost than the latter, which contributes to reduction of the manufacturing cost of the semiconductor device.

However, when the MRAM chips 10-1, 10-2, 10-3 and 10-4 are shifted from each other, parts of the lower surfaces of the MRAM chips 10-2, 10-3 and 10-4, which are not covered with the magnetic shield layers 11B-2, 11B-3 and 11B-4, are exposed.

In light of this, the memory cell array areas 13-2, 13-3 and 13-4 of the MRAM chips 10-2, 10-3 and 10-4 are arranged so as not to overlap with regions Q that are not covered with the magnetic shield layers 11B-2, 11B-3 and 11B-4.

In this case, it is desirable that the distance Y between each region Q and the corresponding MRAM chip 10 be as long as possible.

In FIGS. 16 and 17, the bonding wires 15 connected to the pads 14 of the MRAM chips 10-2, 10-3 and 10-4 are connected to conductive lines (not shown) on the printed board PB, like the bonding wire 15 connected to the pad 14 of the MRAM chip 10-1.

The points in the sixth embodiment other than the above are similar to those in the fifth embodiment. Therefore, elements in FIGS. 16 to 18 similar to those in FIGS. 13 to 15 are denoted by corresponding reference numbers, and no detailed description is given thereof.

(Manufacturing Method)

Method examples of manufacturing the magnetic shield layers of the first to sixth embodiments will now be described.

Figure 19:
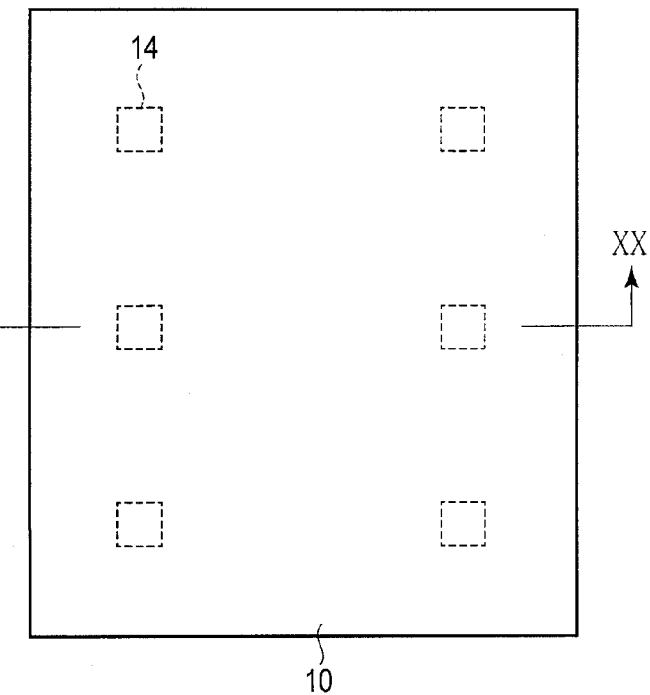
FIG. 19 is a plan view of a first example of a manufacturing method.
Figure 20:
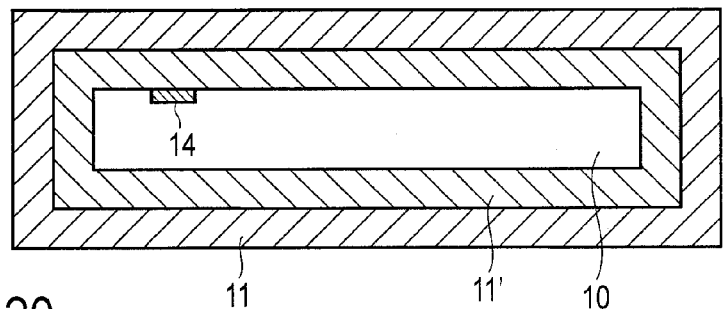
FIG. 20 is a cross-sectional view taken along line XX-XX of FIG. 19.
Figure 21:
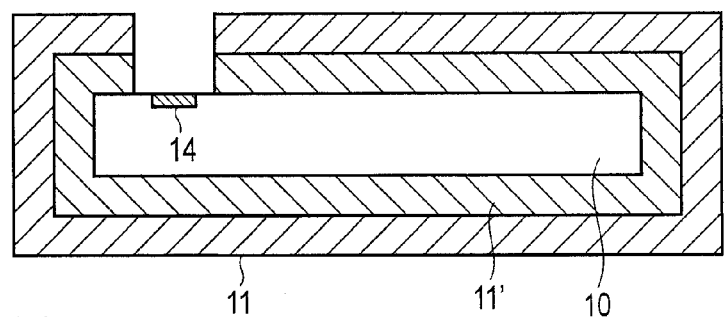
FIG. 21 is a cross-sectional view of the first example of the manufacturing method.

FIGS. 19 to 21 show a first manufacturing method example.

Firstly, as shown in FIGS. 19 and 20, a seed layer (e.g., a metal layer) 11' with a thickness of approx. several atoms is formed by nonelectrolytic plating to cover the MRAM chip 10. The seed layer 11' may be formed by bias deposition or sputtering, instead of nonelectrolytic plating.

Subsequently, a magnetic shield layer 11 is formed by nonelectrolytic plating to cover the seed layer 11'. The magnetic shield layer 11 may be formed by, for example, sputtering, instead of nonelectrolytic plating. However, when the magnetic shield layer 11 is formed over the entire surface of the MRAM chip 10, it is desirable to use nonelectrolytic plating that does not require fixing the MRAM chip 10 to a holder.

When the magnetic shield layer 11 is formed using nonelectrolytic plating, it is possible to form the magnetic shield layer 11 while etching the seed layer 11', by adjusting the pH of the electrolytic solution. In this case, in a final semiconductor device structure, all or part of the seed layer 11' may not exist.

After that, as shown in FIG. 21, parts of the seed layer 11' and the magnetic shield layer 11 are eliminated to expose the pad 14 of the MRAM chip 10.

FIGS. 22 to 25 show a second manufacturing method example.

Figure 22:
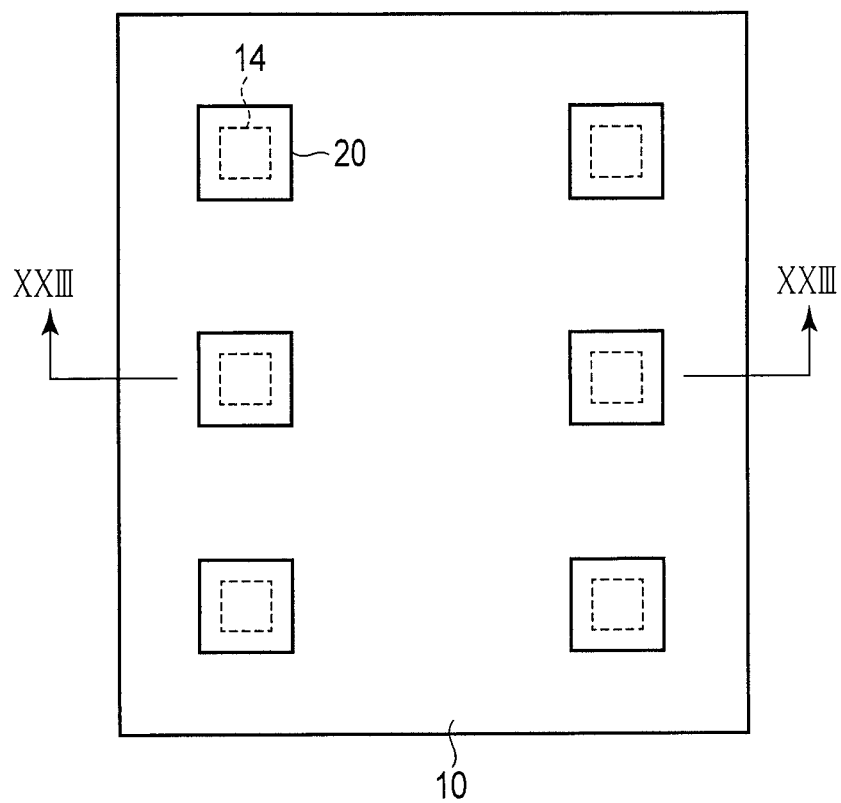
FIG. 22 is a plan view of a second example of the manufacturing method.
Figure 23:
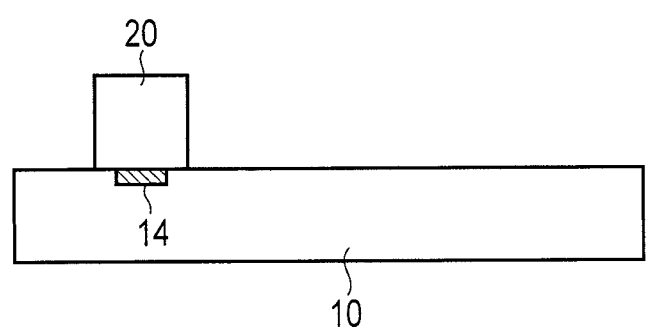
FIG. 23 is a cross-sectional view taken along line XXIII-XXIII of FIG. 22.

Firstly, as shown in FIGS. 22 and 23, a mask layer 20 is formed on the pad 14 of the MRAM chip 10.

Subsequently, as shown in FIG. 24, a seed layer (e.g., a metal layer) 11' with a thickness of approx. several atoms is formed by nonelectrolytic plating to cover the MRAM chip 10. The seed layer 11' may be formed by bias deposition or sputtering, instead of nonelectrolytic plating. After that, a magnetic shield layer 11 is formed by nonelectrolytic plating to cover the seed layer 11'. The magnetic shield layer 11 may be formed by, for example, sputtering, instead of nonelectrolytic plating.

In this example, the seed layer 11' and the magnetic shield layer 11 are not formed in the region in which the mask layer 20 exists.

Thereafter, the mask layer 20 is eliminated to expose the pad 14 of the MRAM chip 10 as shown in FIG. 25.

FIGS. 26 to 31 show a third manufacturing method example.

Figure 26:
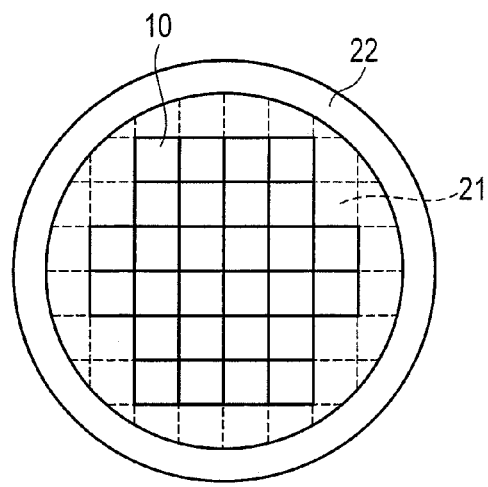
FIG. 26 is a plan view of a third example of the manufacturing method.

Firstly, as shown in FIG. 26, a plurality of MRAM chips 10 are formed on a wafer 21. At this time, the MRAM chips 10 are coupled to each other. After that, the wafer 21 is placed on a dicing tape 22, and the MRAM chips 10 are separated from each other by dicing.

Figure 27:
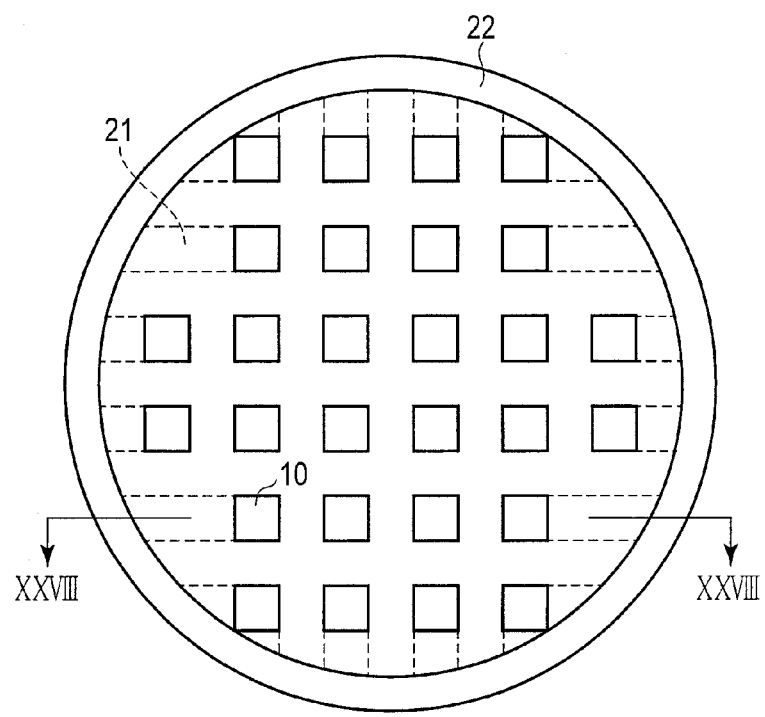
FIG. 27 is a cross-sectional view of the third example of the manufacturing method.
Figure 28:
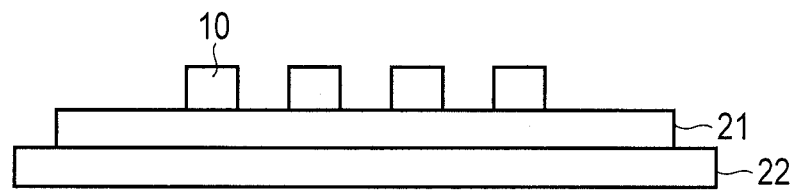
FIG. 28 is a cross-sectional view taken along line XXIII-XXIII of FIG. 27.

Subsequently, as shown in FIGS. 27 and 28, the dicing tape 22 is expanded by a wafer expander, thereby widening the intervals between the MRAM chips 10 on the dicing tape 22.

Figure 29:
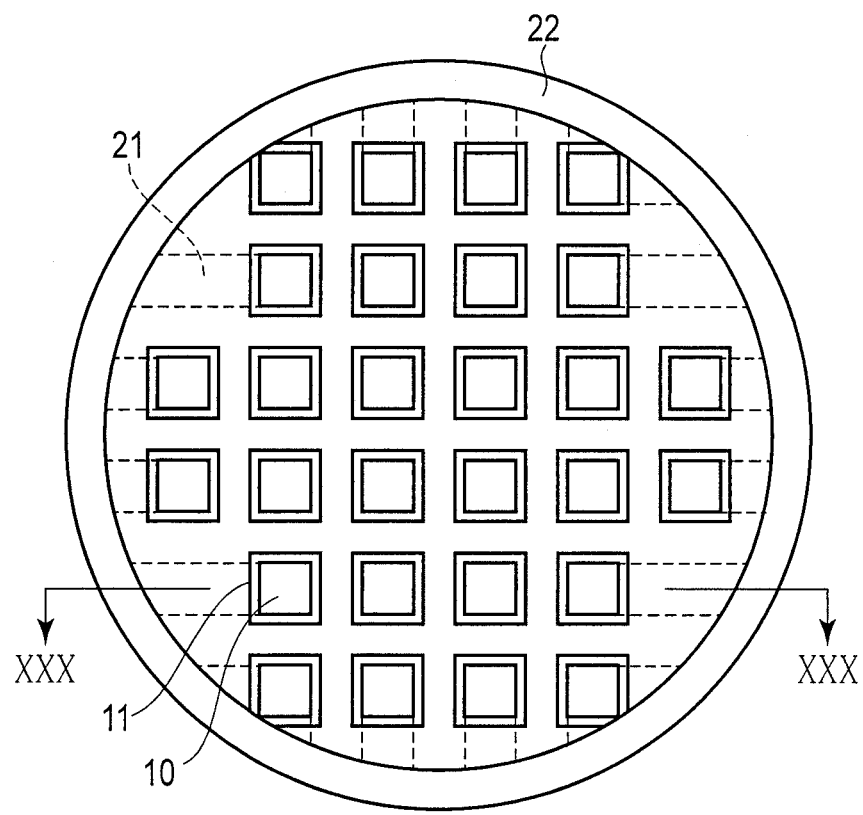
FIG. 29 is a cross-sectional view of the third example of the manufacturing method.
Figure 30:
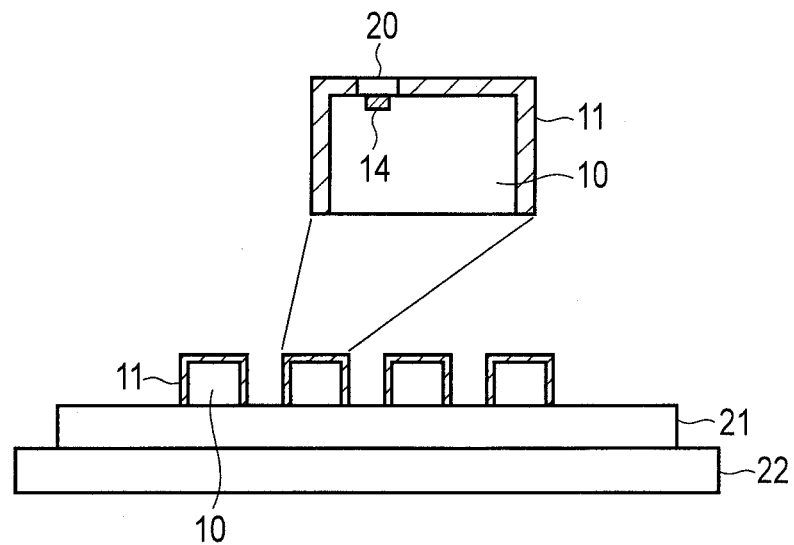
FIG. 30 is a cross-sectional view taken along line XXX-XXX of FIG. 29.

Thereafter, as shown in FIGS. 29 and 30, a mask layer 20 is formed on the pad 14 of each MRAM chip 10. Further, a magnetic shield layer 11 is formed on each MRAM chip 10. The magnetic shield layer 11 can be formed by, for example, the method described in the above-mentioned first or second example. In this example, the magnetic shield layer 11 is not formed on the bottom of each MRAM chip 10 or on the mask layer 20.

Figure 31:
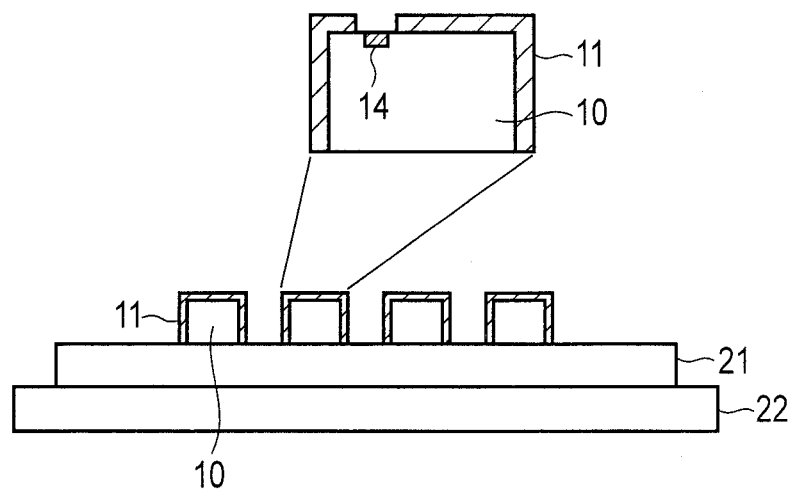
FIG. 31 is a cross-sectional view of the third example of the manufacturing method.

Subsequently, the pad 14 of each MRAM chip 10 is exposed by eliminating the mask layer 20, as is shown in FIG. 31.

Applied Example

A description will be given of a memory cell array area example in a MRAM chip.

FIG. 32 shows an example of an equivalent circuit in a memory cell array area.

A memory cell array 23 comprises a plurality of memory cells MC arranged in an array. Each memory cell includes one magnetoresistive element 10B and one selective transistor (FET) SW.

The magnetoresistive element 10B and the selective transistor SW are connected in series. An end of the series circuit is connected to a first bit line BL1, and the other end of the same is connected to a second bit line BL2. The control terminal (gate terminal) of the selective transistor SW is connected to a word line WL.

The first bit line BL1 extends in a first direction, and has its one end connected to a bit line driver/sinker 24. The second bit line BL2 extends in a second direction, and has its one end connected to a bit line driver/sinker & read circuit 25.

However, the circuit may be modified such that the first bit line BL1 is connected to the bit line driver/sinker & read circuit 25, and the second bit line BL2 is connected to the bit line driver/sinker 24.

Further, the positions of the bit line driver/sinker 24 and the bit line driver/sinker & read circuit 25 may be changed to each other, or be on the same side.

Each word line WL extends in the second direction and has its one end connected to a word line driver 26.

FIG. 33 shows a memory cell example.

A selective transistor SW is located in an active area AA in a semiconductor substrate 27. The active area AA is surrounded by an element isolating layer 28. In this example, the element isolating layer 28 has a shallow trench isolation (STI) structure.

The selective transistor SW comprises source and drain diffusion layers 29a and 29b in the semiconductor substrate 27, a gate insulation layer 30 placed on the channel between the source and drain diffusion layers, and a gate electrode 31 on the gate insulation layer 30. The gate electrode 31 functions as a word line WL.

An interlayer insulation layer 32 covers the selective transistor SW. The interlayer insulation layer 32 has a flat upper surface, on which a lower electrode 33 is provided. The lower electrode 33 is connected to the source/drain diffusion layer 29b of the selective transistor SW via a contact plug 34.

A magnetoresistive element 10B is provided on the lower electrode 33. An upper electrode 35 is provided on the magnetoresistive element 10B. The upper electrode 35 functions as, for example, a hard mask when the magnetoresistive element 10B is processed.

An interlayer insulation layer 36 is provided on the interlayer insulation layer 32 and covers the magnetoresistive element 10B. The interlayer insulation layer 36 has a flat upper surface, on which the first and second bit lines BL1 and BL2 are provided. The first bit line BL1 is connected to the upper electrode 35. The second bit line BL2 is connected to the source/drain diffusion layer 29a of the selective transistor SW via a contact plug 37.

This applied example is applicable to each of the above-described embodiments.

Others

Although the embodiments are directed to semiconductor devices provided with MRAM chips, the above-described basic idea is also applicable to other types of semiconductor chips (such as a CMOS sensor, an MEMS sensor and a magnetic sensor) in which a problem due to the influence of external magnetic fields may be raised.

CONCLUSION

The above embodiments can prevent external magnetic fields from entering the MRAM chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and chancres in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an MRAM chip including a semiconductor substrate, and a memory cell array area comprising magnetoresistive elements which are provided on the semiconductor substrate; and
a magnetic shield layer surrounding the memory cell array area in a circumferential direction of the MRAM chip, and having a closed magnetic path;
wherein the magnetic shield layer is provided outside of the MRAM chip and is in direct contact with an upper surface, a lower surface, and side surfaces of the MRAM chip;
wherein the magnetic shield layer has an opening in which a pad of the MRAM chip is exposed, the opening being adjacent to an end portion of the MRAM chip; and
wherein the memory cell array area is provided further inside of the MRAM chip than the pad of the MRAM chip.

2. The device of claim 1, wherein the magnetic shield layer has a closed loop structure in a first cross section which is perpendicular to a surface of the semiconductor substrate and parallel to the circumferential direction.

3. The device of claim 2, wherein the magnetoresistive elements have magnetizations which are parallel to the first cross section.

4. The device of claim 2, wherein the magnetic shield layer has an end portion in a second cross section which is perpendicular to the first cross section and parallel to the surface of the semiconductor substrate.

5. The device of claim 4, wherein the end portion of the magnetic shield layer is provided outside an end portion of the MRAM chip in the second cross section.

6. The device of claim 1, further comprising a circuit board on which the MRAM chip is mounted.

7. The device of claim 6, wherein the magnetic shield layer comprises a first magnetic layer between a lower surface of the MRAM chip and the circuit board, and a second magnetic layer covering an upper surface and a side surface of the MRAM chip.

8. The device of claim 7, further comprising an upper chip on the MRAM chip, the upper chip including a semiconductor substrate and a memory cell array area comprising magnetoresistive elements,
wherein the magnetic shield layer comprises a third magnetic layer covering an upper surface and a side surface of the upper chip.

9. The device of claim 8, wherein a lower surface of the upper chip contacts the second magnetic layer.

10. The device of claim 9, wherein the second magnetic layer has an end portion outside an end portion of the memory cell array area of the upper chip in a direction which is parallel to a surface of the semiconductor substrate.

\* \* \* \* \*